United States Patent [19]

Shannon

[11] Patent Number: 5,258,864

[45] Date of Patent: Nov. 2, 1993

[54] METHOD OF FABRICATING MIM DEVICE ARRAYS USING A SINGLE EXPOSURE AND LIFT-OFF PROCESS

[75] Inventor: John M. Shannon, Whyte Leafe, England

[73] Assignee: U.S. Philips Corporation, New York, N.Y.

[21] Appl. No.: 869,408

[22] Filed: Apr. 16, 1992

[30] Foreign Application Priority Data

May 17, 1991 [GB] United Kingdom ............... 9110737

[51] Int. Cl.⁵ .................... G02F 1/1335; C09K 19/00
[52] U.S. Cl. ........................................ 359/58; 359/62; 430/20
[58] Field of Search ............... 430/318, 20; 359/57, 359/58, 60; 287/30, 40, 49

[56] References Cited

U.S. PATENT DOCUMENTS

| | | | |
|---|---|---|---|
| 4,396,458 | 8/1983 | Platter et al. | 430/318 |
| 4,534,623 | 8/1985 | Araki | 257/30 |
| 4,895,789 | 1/1990 | Motte et al. | 350/58 X |

*Primary Examiner*—William L. Sikes
*Assistant Examiner*—Kenneth Parker
*Attorney, Agent, or Firm*—John C. Fox

[57] ABSTRACT

A method of fabricating an array of MIM type devices together with associated address conductors and pad electrodes on a common support (11) suitable for use as a component in an active matrix display device, involves depositing a first, conductive, layer (30) and a second selectively etchable layer (31) in succession over the support, performing a photolithographic patterning process (35) to leave regions (32,33) of the layers determining eventual pad electrodes (25) and address conductors (28) with bridging portions (34), and thereafter performing further processing operations involving the deposition of further layers (36, 40, 41), including an insulating layer (40) and a further conductive layer (41), and the etching of particular layers, together with lift-off procedures, to define on the support an array of pad electrodes each connected to an address conductor through a MIM type device (10,45) at the region of the bridging portion. Advantageously, the method requires the use of only one conventional mask and a single exposure.

8 Claims, 5 Drawing Sheets

METHOD OF FABRICATING MIM DEVICE ARRAYS USING A SINGLE EXPOSURE AND LIFT-OFF PROCESS

BACKGROUND OF THE INVENTION

This invention relates to a method of producing an array of MIM type devices, together with associated address conductors and pad electrodes, on a common support for use particularly, although not exclusively, in active matrix addressed display devices, for example liquid crystal display devices.

Known MIM devices, generally comprising a thin film insulating layer sandwiched between two conductive layers across which in use a voltage is applied, can be regarded as a kind of diode structure in that they exhibit a non-linear resistive characteristic and have been used in active matrix addressed liquid crystal display devices as switching elements in the addressing of the display device's picture elements. These two terminal devices offer advantages over TFTs also used for such purposes in that they are comparatively simple to fabricate and require fewer address lines, with no crossovers, on their supporting substrate.

Examples of arrays of MIM devices for liquid crystal display devices and their methods of fabrication are described in U.S. Pat. Nos. 4413883 and 4683183. The display devices consist of first and second glass substrates carrying respectively sets of row and column address conductors with individual picture elements being provided at the region of the intersections of the crossing conductors. A picture element electrode carried on the first substrate is connected electrically to a row conductor via at least one MIM device which is also carried on the first substrate. The MIM devices act as bidirectional switches controlling operation of their associated picture elements. By virtue of their non-linear resistance behaviour, the devices exhibit a threshold characteristic and in operation are turned on in response to a sufficiently high applied field to allow video data signal voltages to be transferred to the picture elements to cause the desired display response.

Although such a device is generally referred to as a Metal-Insulator-Metal device, conductive materials such as indium tin oxide (ITO) can be used as one or both of the "metal" layers and the acronym should be construed accordingly. Moreover, the terms "insulator" and "insulating layer" as used herein are intended to be construed in the wider sense to include semi-insulators and non-stoichiometric materials known in the field of MIM devices. The switching characteristics are dependent on the composition and thickness of the insulating layer and are determined by the charge transfer mechanisms involved. The switching behaviour of many MIM devices results from tunnelling or hopping of carriers in the thin film insulating layer and in this respect the voltage/resistance characteristic of the device is dependent on the magnitude of the electric field and thus the nature and thickness of the insulating layer. In some forms of MIM devices the mechanism is controlled by the barrier between the metal and the (semi-) insulator.

The aforementioned specifications describe various forms of MIM devices using different materials. For the conductive layers, these can include nickel, chromium, tantalum, aluminium or ITO. The insulator layer may be of tantalum pentoxide, silicon nitride, silicon dioxide, silicon oxynitride, silicon monoxide or zinc oxide. Further examples of MIM structures used in display devices, comprising non-stoichiometric materials, are described in EP-A-0182484.

Active matrix addressed types of display devices are comparatively expensive to produce. Although active matrix substrates of display devices using MIM devices are generally simpler to construct, and thus less expensive, than those using TFTs as switching elements, there is still a need for further improvements in the manufacturing processes. Methods of fabricating arrays of MIM type devices with picture element electrodes and address conductors on substrates described in the aforementioned specifications involve a plurality of photolithographic patterning processes using separate masks and separate exposures which, besides requiring expensive equipment, can also lead to problems, especially with the need for accurate alignment and registration. These problems become even more significant when fabricating comparatively large area or high density arrays or arrays on flexible substrates.

OBJECTIVES AND SUMMARY OF THE INVENTION

It is, therefore, an object of the invention to provide an improved method of fabricating an array of MIM type devices on a substrate, together with addressing conductors and associated electrodes.

It is another object of the present invention to provide a method of fabricating arrays of MIM type devices with pad electrodes and address conductors which requires a minimal number of masks and exposures.

It is a further object of the present invention to provide an array of MIM type devices together with addressing conductors and associated electrodes on a common support which is suitable for use in an active matrix addressed display device.

According to a first aspect of the present invention there is provided a method of fabricating an array of MIM type devices together with address conductors and pad electrodes on a common substrate, each pad electrode being connected to an associated address conductor via at least one MIM type device, which method comprises the steps of: (a) providing over the substrate surface a first layer of a selectively etchable conductive material and a second layer of a different, selectively etchable, material overlying the first layer; (b) performing a patterning process on the first and second layers with the aid of a mask to leave regions of the two layer structure determining the pad electrodes and the address conductors and a comparatively narrow portion bridging each pad electrode and an associated address conductor; (c) depositing a third layer of a selectively etchable material different to said first and second layers so as to cover said regions of the two layer structure and intervening areas; (d) performing selective etching to remove first and second layer parts at the bridging portions, with lift-off of overlying material, to expose underlying surface regions of the substrate; (e) depositing fourth and fifth layers comprising insulating and conducting material respectively in succession over the substrate; and thereafter (f) removing the remaining regions of the second and third layers, together with overlying material, by selective etching so as to leave first layer regions constituting the pad electrodes and the address conductors, and bridges of superposed fourth and fifth layer materials extending between each pad electrode and its associated address conductor on the said surface regions of the substrate, thereby forming a MIM type device through which the pad electrode is connected to the address conductor.

The method thus involves using temporary layers which serve in effect to define, in the manner of a mask, layer portions which are required in the final structure. For example, the third layer serves as an inverse mask for the purpose of defining regions of the fourth and fifth layers which are to remain and regions which are to be removed. This approach enables an array of MIM type devices, together with a set of address conductors and a plurality of pad electrodes, to be fabricated in a manner which requires the use of only one conventional mask and a single exposure and consequently offers a considerable advantage over the kinds of methods described in the aforementioned specifications. Importantly, a one mask, single exposure fabrication process avoids registration, and hence the problems caused by the need for accurate alignment necessary in a multiple mask, multiple exposure process. A one mask, single exposure method readily enables large area arrays, and thus display devices, to be produced in a reasonably simple and inexpensive manner without sophisticated photolithographic equipment. Moreover, such a process is well suited to fabricating high density arrays and also arrays on substrates which are flexible, for example of plastics.

Preferably, the selective etching and lift off procedure through which the first and second layer parts and overlying material at the bridging portions are removed comprises the steps of selectively etching the material of the second layer to form a discontinuity in this layer with lift-off of the overlying portions of the third layer at the bridging portions and thereafter etching away the parts of the first layer exposed by the discontinuities. At this stage, the upper surfaces of the patterned regions of the second layer are covered and consequently the selective etching of the second layer takes place laterally at exposed edges. Because the bridging portions are comparatively narrow and etched from both sides, the required discontinuities, and lift-off of overlying material, are conveniently obtained by limited etching. Although at the same time material of the second layer at other edges of the patterned regions will be etched, these regions are considerably larger in area compared with the bridging portions so that the amount of material removed is relatively minor. The remaining areas of the second layer adequately shield the underlying areas of the first layer during the subsequent etching operation to remove the exposed parts of first layer at the bridging portions.

The upper surfaces of the patterned second layer may be covered directly by respective portions of the third layer. Preferably, however, regions of a photoresist layer used in the patterning process which cover the remaining regions of the two layer structure after patterning are left in situ while the third, fourth and fifth layers are deposited and are thereafter removed, with lift-off of overlying material, i.e. corresponding portions of the third, fourth and fifth layers, to expose the upper surface of the remaining regions of the second layer. The exposure of the upper surface of the remaining regions of the second layer in this way facilitates the step of removing these regions by etching.

In a preferred embodiment, after the aforementioned step of selective etching of the material of the second layer to form discontinuities and the removal of the parts of the first layer at the bridging portions and before the step of depositing the fourth, insulator, layer, the material of the second layer is subjected to further, limited, selective etching whereby further parts of the second layer are removed adjacent the ends of the discontinuities to expose respective upper surface edge portions of the regions of the first layer at opposing ends of the discontinuities. Thus, when the fourth, insulating, layer and the fifth, conducting, layer are deposited, they extend over these edge portions of the first layer. This ensures that a favourable form of MIM type device structure is obtained.

Desirably, the ends of the bridging portion regions of the two layer structure defined in the patterning process are of increased width. When the material of the second layer is subjected to the first selective etch operation, then, by appropriately controlling this operation, the material of the second layer at the central, relatively narrow, part of the bridging portions is completely removed, forming the discontinuity, and in the subsequent selective etching operation the second layer material at the ends of the bridging portion is removed to expose the underlying first layer material, constituting the aforementioned upper surface edge portions.

The MIM type devices produced by the method of the present invention are of a lateral kind exhibiting substantially symmetrical behavious in operation. At opposite ends of each bridge, where they connect with a pad electrode and row address conductor respectively, a conductor-insulator-conductor structure, forming a MIM element, is obtained. Each MIM type device thus comprises two such structures which, with their upper conductor parts being interconnected through the conducting layer of the bridge, are series connected and arranged back to back.

Although particularly suitable for use as a component in an active matrix addressed display device, with the pad electrodes used as picture element electrodes, it is envisaged that the array of MIM type devices formed together with their set of address conductors and pad electrodes on a common substrate by this method could be used as a component in other devices, possibly with further components being formed on the substrate.

For a transmissive display device the first layer, constituting the picture element pad electrodes, should be of a transparent conductive material such as ITO. However, the address conductors, formed from the same material, may then exhibit greater resistance than desirable in certain situations. In this case, the method of the invention may comprise further steps which result in strips of higher conductivity material, preferably a metal, being provided on the patterned regions of the first layer constituting the address conductors and pad electrodes. This can be achieved in a simple and convenient manner in a modification of the method according to the embodiment of the present invention in which the resist is left in situ until after deposition of the fourth and fifth layers and in which the material of the second layer is subjected to a further selective etching operation. The further steps comprise, after the fourth and fifth layers have been deposited, depositing over the substrate a further, sixth, layer of the same material as the second layer and then, after the steps of removing the resist material with lift off of the overlying materials and before the step of removing remaining regions of the second and third layers, depositing over the substrate a seventh layer which is of metal and different to the materials of the first, second and third layers. As a result of the limited selective etching of the second layer material, the edges of this material are inwardly recessed with respect to the overlying regions of resist material. Therefore, when the seventh, metal, layer is deposited after removal of the resist, edge portions of the underlying regions of the first layer are covered directly by this metal over a distance corresponding approximately to the dimensions of the recesses. Unwanted areas of this metal layer are removed by lift off when the second and third layers, and remaining areas of the sixth layer, are etched away, to leave strips of the metal on the surface of, and bordering, the remaining regions of the first layer. In the final structure, these strips extend along the address conductors and around the pad electrodes.

The material used for the different layers can be various, providing that they are capable of being selectively etched where necessary. The second, third and fifth layers may comprise metals, such as aluminium, tungsten and chromium respectively. Other possible, alternative materials include tantalum, nichrome and titanium. The sixth layer and the seventh layer, when used, may comprise respectively aluminium, corresponding to the second layer, and chromium or molybdenum. The fourth layer can comprise any insulator material known in the art of MIM devices such as silicon dioxide, silicon monoxide, silicon nitride, silicon carbide, non-stoichiometric, for example silicon-rich, mixtures of these materials such as nonstoichiometric silicon nitride or silicon oxynitride, or tantalum oxynitrides.

According to another aspect of the invention there is provided an active matrix addressed display device, for example a liquid crystal display device, having a matrix array of picture elements each comprising a first, pad, electrode and a second opposing electrode carried on facing surface of two spaced supports with electro-optic material therebetween and with the pad electrode of each picture element being connected to an associated one of a set of address conductors on one substrate via at least one MIM type device, which is characterised in that the MIM type devices, the set of address conductors and the pad electrodes on the one substrate are fabricated by the method according to the first aspect of the present invention.

BRIEF DESCRIPTION OF DRAWINGS

Methods of fabricating arrays of MIM type devices together with address conductors and pad electrodes on a common substrate and active matrix addressed liquid crystal display devices incorporating such arrays, in accordance with the present invention will now be described, by way of example, with reference to the accompanying drawings, in which.

It should be understood that the Figures are merely schematic and are not drawn to scale. In particular certain dimensions such as the thickness of layers or regions may have been exaggerated whilst other dimensions may have been reduced. It should also be understood that the same reference numerals have been used throughout the Figures to indicate the same or similar parts.

DESCRIPTION OF THE PREFERRED EMBODIMENT

Figure 1:
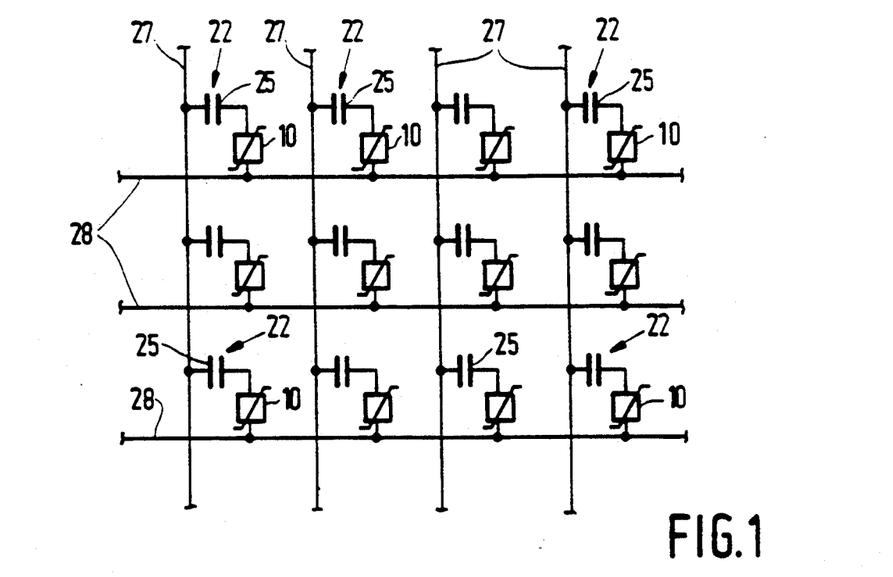
FIG. 1 is a schematic circuit diagram of part of a liquid crystal display device showing a number of picture elements each connected in series with a two terminal, non-linear switching element in the form of a MIM type device between row and column address conductors.
Figure 2:
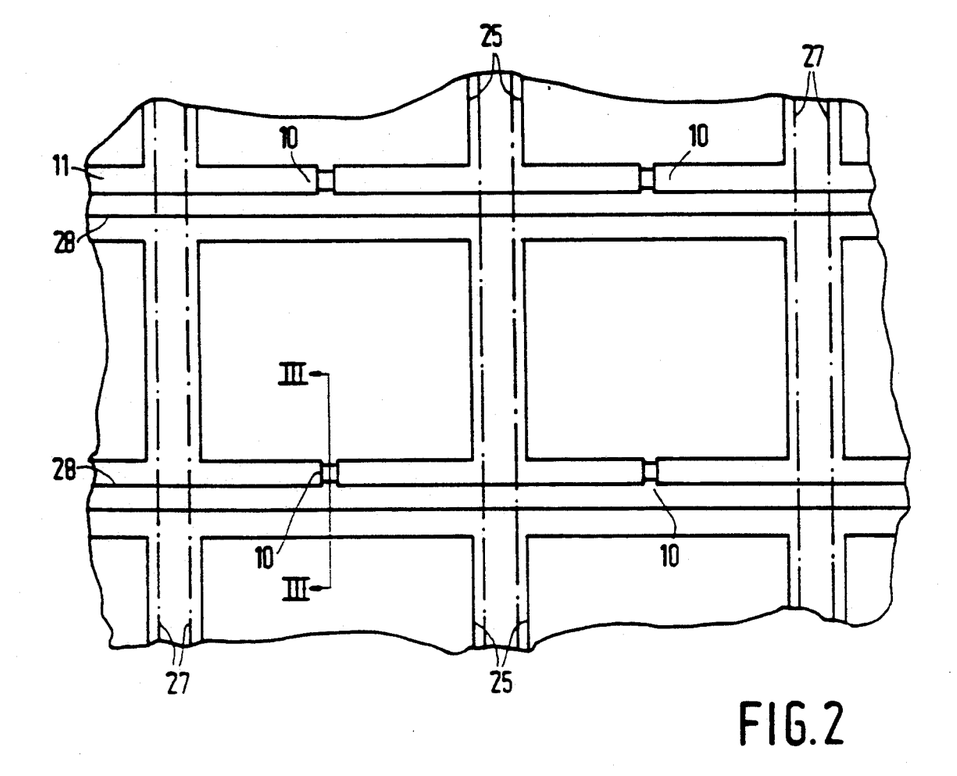
FIGS. 2 and 3 are respectively a plan view and a cross-sectional view, along the lines III—III of FIG. 2, of parts of one embodiment of the display device.
Figure 3:
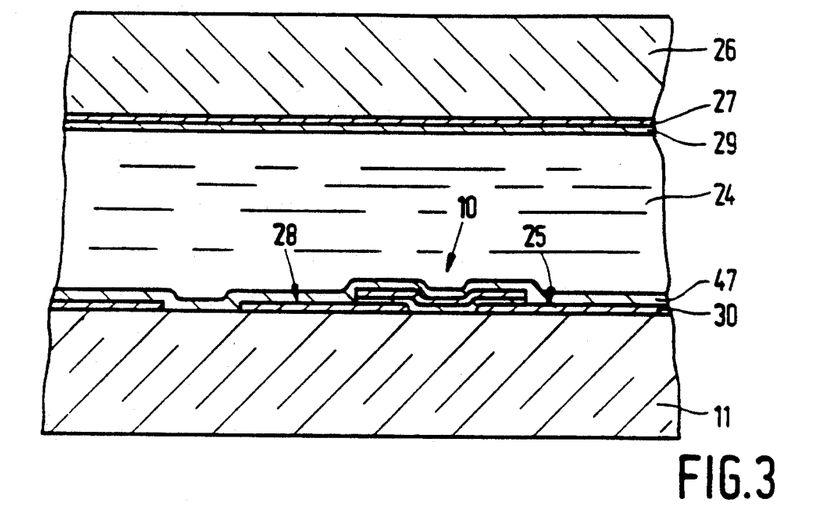

Referring to FIGS. 1 to 3, the display device has a row and column matrix array of individual picture elements 22, only twelve of which are depicted in FIG. 1. Each element 22 comprises a pair of electrodes carried on the facing surface of two, spaced, glass substrates 11 and 26 with TN liquid crystal material 24 therebetween (FIG. 3). The substrate 11 carries an array of MIM type devices and in addition, an array of individual, generally rectangular, picture element pad electrodes 25 arranged in rows and columns and defining individual picture elements 22. The substrate 26, as is usual for such display devices, carries a set of spaced, parallel, column address conductors 27, of transparent ITO, portions of which, where they overlie picture element electrodes 25, constitute the other electrodes of the picture elements. The part of the display device comprising the glass substrate 26 and set of column conductors 27 is fabricated in conventional manner by deposition and definition of ITO material. The surface of the structure is covered by an LC orientation layer 29 of known type.

The picture element electrodes 25 of all picture elements in the same row are connected on the substrate 11 to an associated one of a set of parallel row address conductors 28 extending at right angles to the column conductors 27 via their associated, series-connected, MIM type devices 10.

The individual picture elements 22 are addressed in conventional fashion by applying scanning signals to each row conductor 28 in turn and video data signals appropriately, in synchronism, to the column conductors 27 (or vice versa) to operate the picture elements and modulate light transmission there through in accordance with supplied video information. The elements are typically driven using an applied voltage of between 11 and 15 volts. They are energised on a row at a time basis so as to build up a display picture, e.g. a TV picture, over one field. The display device, and its operation, is similar in many respects to known active matrix LC display devices using MIM type non-linear switching elements. Accordingly, the foregoing general description of the display device has deliberately been kept brief. For further information, reference is invited to the specifications mentioned earlier whose disclosure in these general respects is incorporated herein by reference.

Referring now particularly to FIGS. 2 and 3, each MIM type device 10 connected between a picture element pad electrode 25 and a row conductor 28 comprises a pair of spaced terminals, integral with the row conductor 28 and electrode 25 respectively, and superimposed, co-extensive strip shape insulating and conducting layer which overlie and extend between the spaced terminals. The method by which the picture element pad electrodes 25, row address conductors 28 and MIM type devices 10 are fabricated on the substrate 11 will now be described with reference particularly to FIGS. 4a to 4g and FIG. 5.

Figure 4A:
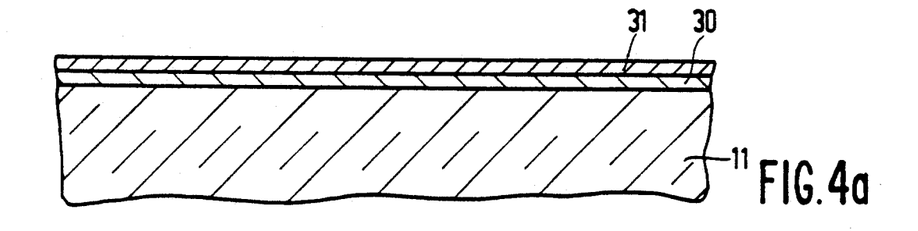
FIGS. 4a through 4g are cross-sectional views illustrating various stages in the fabrication of a typical MIM type device, address conductor and pad electrode on a substrate of the display device.
Figure 4B:
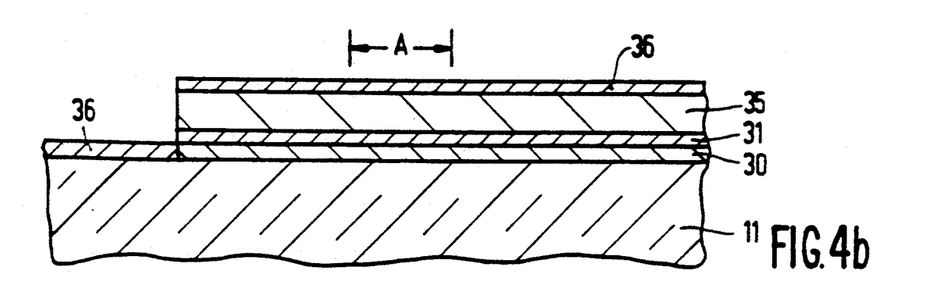

A two layer structure is built up on the substrate 11 as shown in FIG. 4a by successively depositing continuous and uniform thickness layers 30 and 31 of a transparent conductive material, in this case ITO, and then a selectively etchable material, in this case aluminium, using any suitable technique. The two layer structure is then patterned using a photolithographic process which involves depositing a layer of photo-resist over the surface of the layer 31, subjecting the photo-resist to a single exposure through a mask and then removing unexposed regions to produce a resist pattern defining regions of the two layer structure which are to be retained. For larger area arrays, the exposure operation may be carried out in step-wise fashion. The unwanted regions of the two layers are then removed by reactive ion or sputter etching whereby the two layers unprotected by resist are etched vertically downwards to the substrate surface. FIG. 5 shows in plan view a small portion of the patterned structure thus obtained using the one mask. This consists of rows of generally square regions 32, eventually determining the pad electrodes 25, and strips 33 extending between adjacent rows, eventually determining the row conductors 28, and comparatively narrow bridging portions 34 interconnecting each pad electrode 25 with an associated row conductor 28. Each bridging portion 34 comprises a central, narrow, part of length A and two enlarged end parts of slightly greater width but shorter length, B. The cross-sectional views shown in FIGS. 4a to 4g are taken along the line IV—IV of FIG. 5 through the middle of a typical bridging portion 34.

The resist material remaining after patterning the two layer structure, i.e. those portions covering defined regions of layers 30 and 31, is left in situ. A uniform thickness layer of tungsten is then evaporated vertically downwards over the entire surface of the substrate 11 to cover the exposed surfaces of the resist and the substrate 11 producing the structure shown in FIG. 4b, in which the resist material is referenced at 35 and the tungsten layer is referenced at 36.

This structure is subjected to a limited selective isotropic etch, using for example a wet etch process, which is effective on only the material of the layer 31. This etching is performed until the narrow central parts of length A of the bridge portions 34 are completely removed by under-etching, thereby forming a discontinuity of approximately length A in the layer 31 between the regions 32 and 33, and is then terminated. Although material of the layer 31 at other edges of the patterned regions is also etched away in this operation, the amount concerned is relatively minor bearing in mind that the central parts of the bridging portions 34 are of considerably reduced width and are etched from two sides simultaneously so that the extent of etching necessary to form the discontinuities is comparatively small. By way of example, initially the width of the strip 33 may be around 20 micrometres, the central parts of the bridging portions 34 may be around 10 micrometers in length and 3 micrometers in width, and the end parts of the bridging portions 34 may be around 16 micrometers in width and 10 micrometers in length. The layers 30, 31 and 36 may be around 100 nm in thickness and the resist layer 35 around 1 micrometer.

Figure 4C:
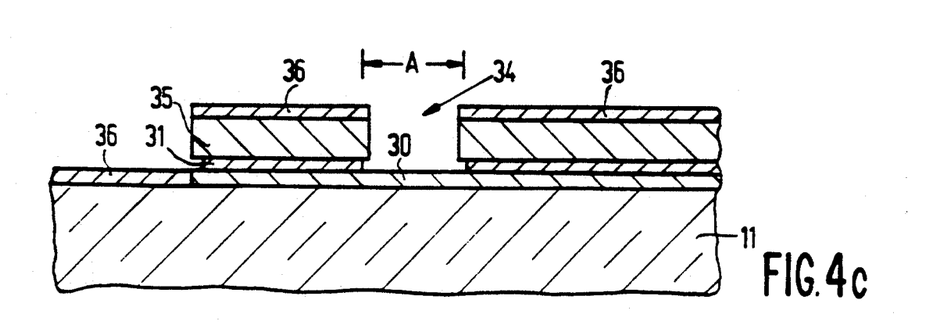
Figure 4D:
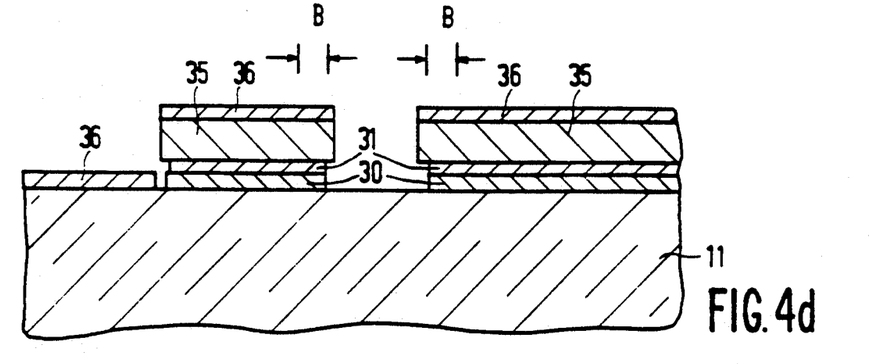
Figure 5:
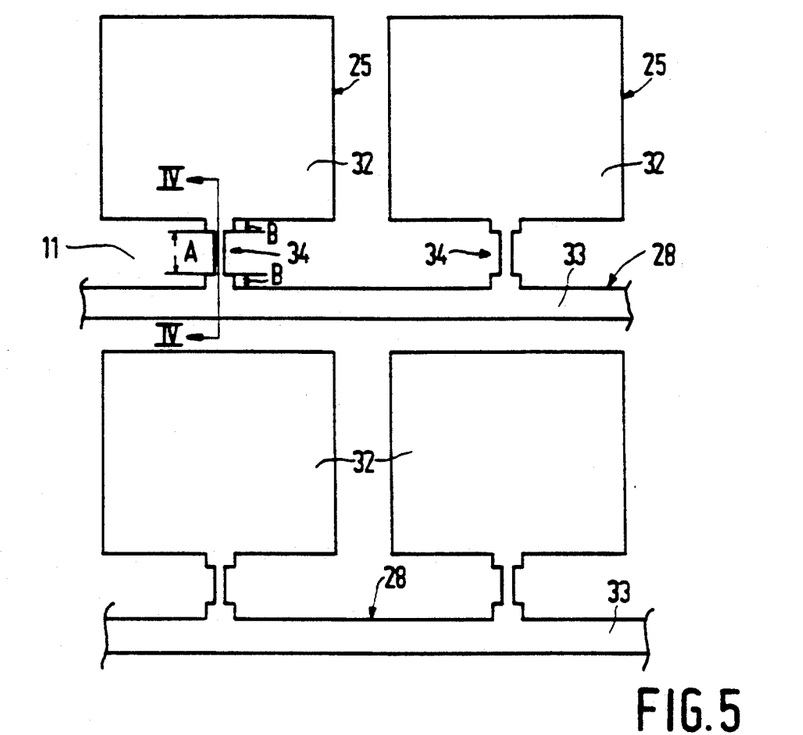
FIG. 5 is a plan view of part of the substrate of the display device at one fabrication stage.

As a result of the removal of the material of the layer 31 at the central parts of the bridging portions 34, the immediately overlying portions of the resist 35 and the layer 36 of a length slightly less than A are also removed by lift-off producing the structure illustrated in FIG. 4c in which the regions of the layer 30 at the central parts of the bridging portions 34 are now exposed. These parts of the ITO material are then vertically etched away completely to adjacent the edges of the layer 31, using a plasma etch process, as shown in FIG. 4d. As a result of this step a trough is formed by the parallel edges of the layer 36 at either side of the original central parts of the bridging portion of dimensions corresponding to the original central part and extending between the regions 32 an 33.

Figure 4E:
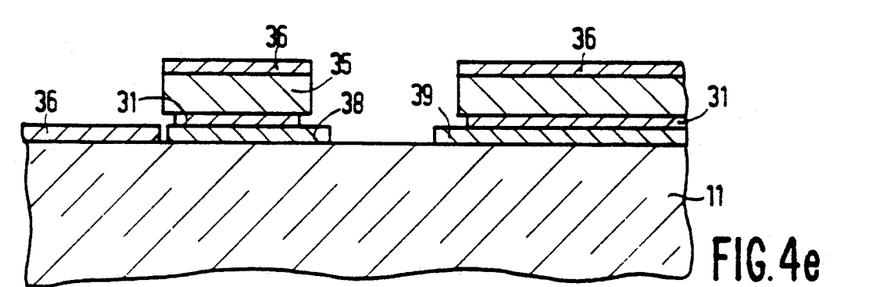

A further selective etching operation is then performed on the aluminium material of the layer 31, in similar manner to the previous selective etching process, to remove further portions of this material at the regions of the end parts of the bridging portions 34 over approximately their length B, following which the etch is terminated. These end parts are etched from three sides so that the required removal of the aluminium material at these regions is achieved with only slight loss of aluminium at other edges of the layer 31. The immediately overlying parts of the resist and tungsten layers 35 and 36 are then removed by lift-off over a length slightly less than B, thereby exposing the surfaces, indicated at 38 and 39, of the regions of the ITO layer 30 approximately corresponding to dimensions of the end parts of the bridging portions 34, as shown in FIG. 4e.

Figure 4F:
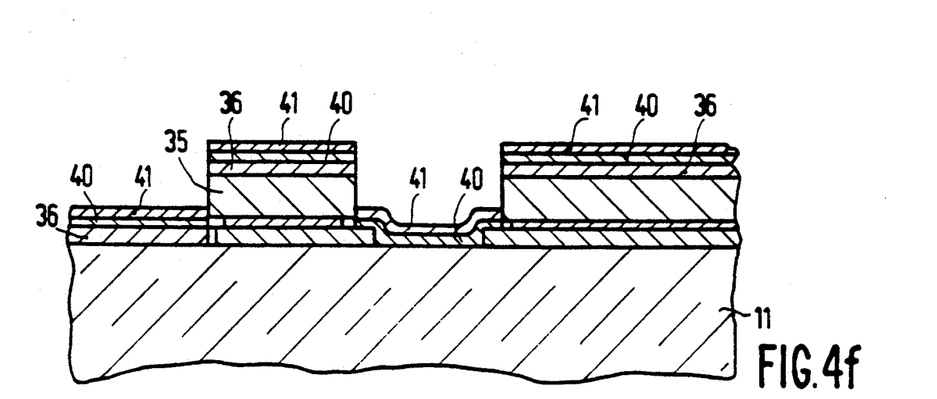
Figure 4G:
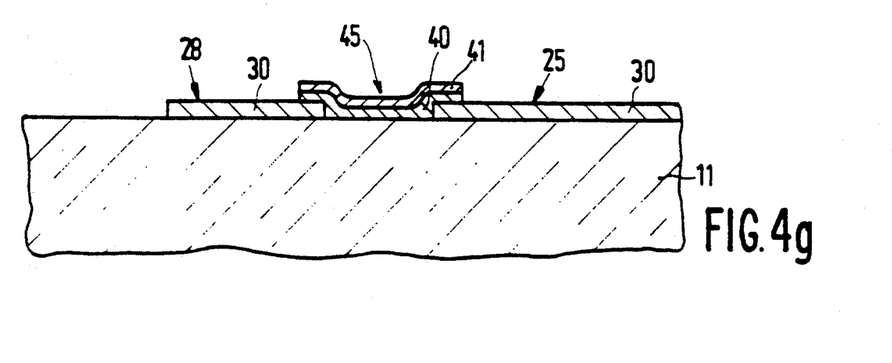

Thereafter, successive layers 40 and 41 of silicon-rich silicon nitride insulating material and chromium respectively are evaporated vertically downwardly over the entire surface of the substrate 11 forming the structure depicted in FIG. 4f in which edges of the layers 40 and 41 are co-terminous. At the aforementioned troughs bounded by the layer 36 between the regions 32 and 33 these superimposed layers lie directly on the substrate surface and extend onto the exposed shoulders of the ITO regions adjacent the ends of these troughs. At all other regions, the superimposed layers lie directly on areas of the tungsten layer 36.

The resist is then removed, taking with it the overlying regions of the layers 36, 40 and 41 and exposing the upper surfaces of the remaining regions of the layer 31. Finally, these remaining regions and the remaining regions of layer 36 on the substrate surface are removed by appropriate etching to leave the structure shown in FIG. 4g in which the regions of the ITO layer 30 which are left constitute the pad electrodes 25 and the row conductors 28 and in which each electrode 25 is connected to an associated conductor via a bridge 45 comprising superimposed strip portions of the layers 40 and 41 corresponding in shape approximately with the original shape of the bridging portions 34. Each bridge 45 in conjunction with the underlying areas of ITO material at its ends constitutes a MIM type device 10. The device 10 is of lateral form whose two terminals comprise respectively the overlapping parts of the pad electrode 25 and row conductor 28 and which has insulator and conductor material extending over and between these two parts.

Figure 6:
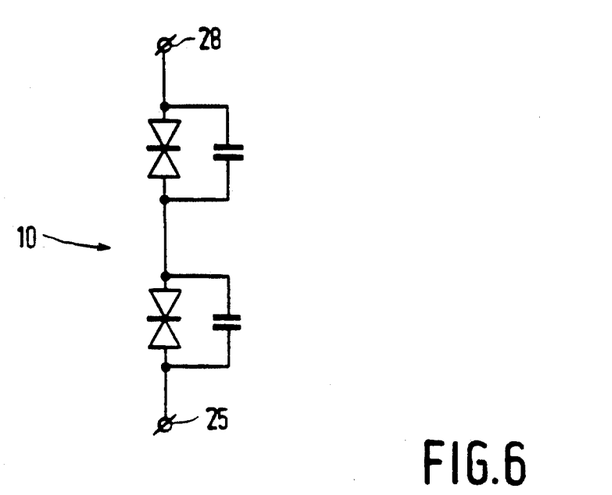
FIG. 6 is an equivalent circuit representation of a MIM type device of the display device.

The MIM type devices 10 demonstrate a switching characteristic by virture of their non-linear current/voltage property given by their insulator layer and exhibit substantially symmetrical behaviour in operation showing substantially identical switching effects in response to opposing polarity voltages of the same magnitude being applied. They can be considered for simplicity as equivalent functionally to two non-linear MIM like elements connected in series back to back, the two elements each consisting of the respective part of layer 30 together with their immediately overlying portions of the layers 40 and 41, the parts of layer 41 serving in effect as second terminals of the elements. These second terminals of the two elements are interconnected via the intermediate part of the layer 41. A simple equivalent circuit representation of a MIM type device 10 is illustrated in FIG. 6.

For use in a liquid crystal display device, the structure on the substrate 11 is completed by the provision of a continuous layer, 47, of LC orientation material, thus providing the component part illustrated in FIG. 3.

The above-described method offers the considerable advantage of reducing the amount of photolithography compared with previous methods. The method entails a one mask, single exposure, process and utilises temporary, sacrificial, layers and a series of lift-off procedures to form the required structures rather than a multiple mask type of process. The layer 36, for example, acts as an inverse mask to facilitate removal of unwanted areas of deposited insulating and conducting layers 40 and 41 and in defining the bridge 45. The aluminium layer 31 acts like a mask in the removal at the bridge portions of overlying material and underlying ITO. In turn the resist 35 serves as a mask when the underlying aluminium is being etched. Because only a single mask lithographic process is used the problems caused by registration difficulties in multiple mask processes are eliminated. Moreover, the described method is suitable for producing MIM type device arrays, with pad electrodes and address conductors, on a transparent substrate of flexible material as well as glass substrates as in the above embodiment. The method is particularly well suited to producing structures comprising comparatively small size elements, as are required for example of projection display systems or display devices using sub-pixellated arrays.

Figure 7A:
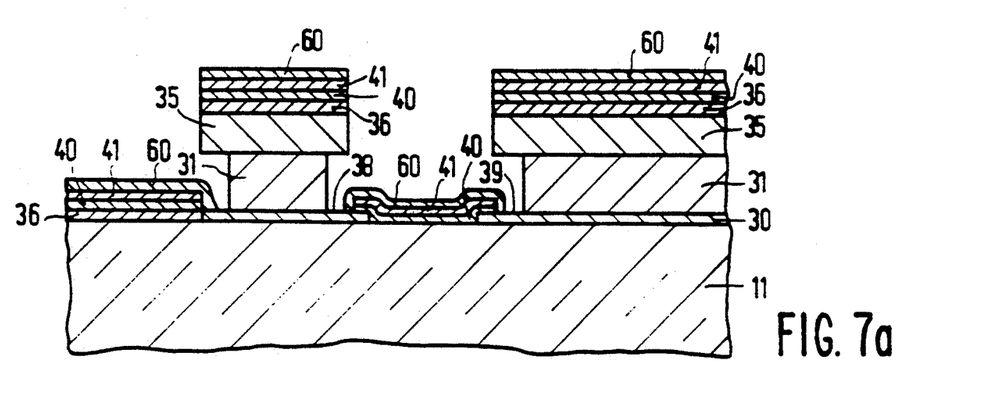
FIGS. 7a to 7d illustrate various stages in the fabrication of the MIM type devices, address conductors and pad electrodes using a modified method.
Figure 7B:
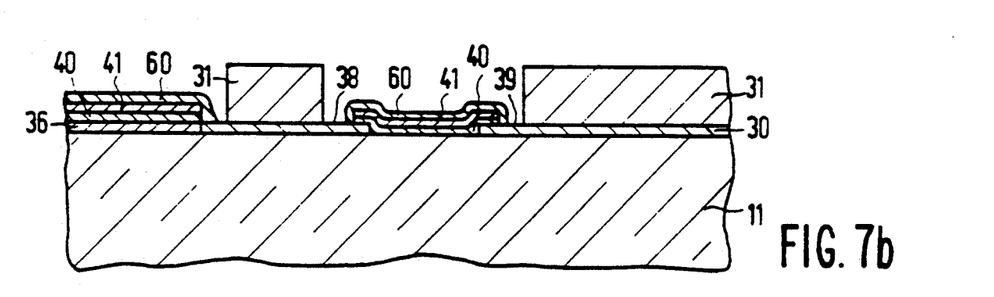

The above-described method results in address conductors, 28, consisting solely of ITO material. FIGS. 7a to 7d illustrate a modification of this method, involving additional steps, through which address conductors of increased conductivity are obtained. The first stages in this second method follow those of the previous method up to the deposition of the silicon nitride and chromium layers 40 and 41 (FIG. 4f) except that the thickness of the aluminium layer 31 is increased so that it is greater than the combined thicknesses of the layers 40 and 41. For example, the layer 31 may be around 1.5 micrometers in thickness and the layers 40 and 41 each around 50 nm. After the layers 40 and 41 have been deposited and before the resist material 35 is removed, the structure is subjected to an additional selective dip etch by which the aluminium layer 31 is etched back further if necessary so as to provide a sufficient spacing between the edges of the superimposed layers 40 and 41 and the cut-back side of the aluminium layer 31 at the regions 38 and 39 and then a further layer of aluminium is evaporated generally downwards, but with some lateral divergence, over the entire substrate. The resulting structure is illustrated in FIG. 7a in which the additional aluminium layer is indicated at 60. The layers 40 and 41 are very thin compared with the aluminium layer 31 and thus the second aluminium layer 60, due to the manner of its deposition, spreads over the edges of the superimposed layers 40 and 41 onto the adjacent surface of the ITO layer 30 at the regions 38 and 39, as shown in FIG. 7a. Thereafter, as shown in FIG. 7b, the resist material 35 is removed, as before, taking with it the overlying regions of the layers 36, 40, 41 and 60. The surface areas 38 and 39 of the upper surface of the layer 30, previously shielded by the overhangs at the periphery of the resist regions, are now fully exposed.

Figure 7C:
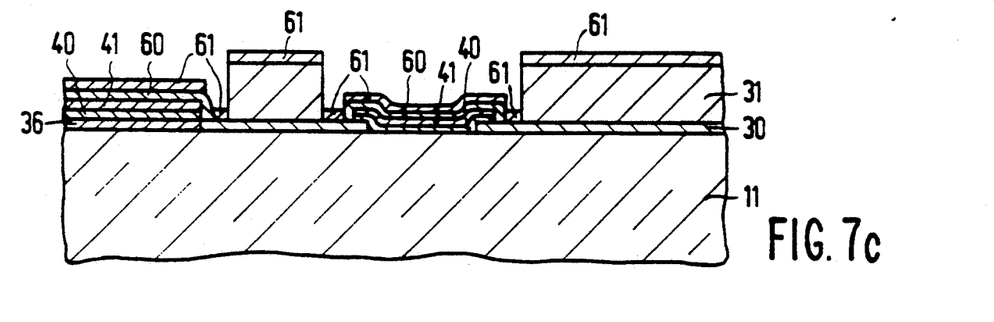
Figure 7D:
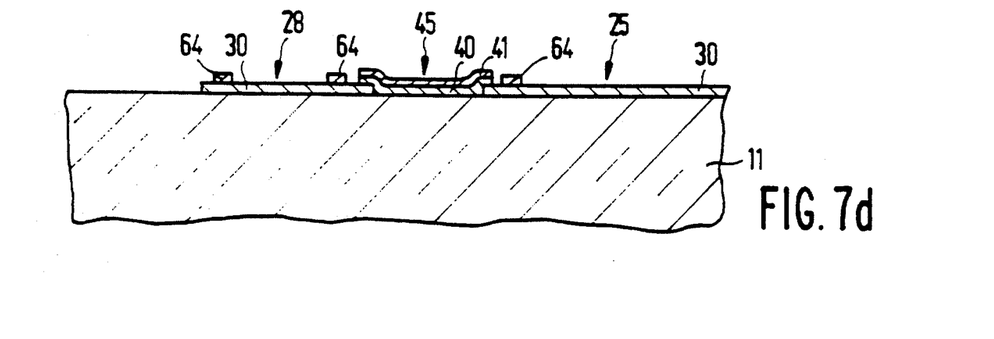

A metal layer, in this example chromium, is then evaporated vertically downwards over the substrate, as shown at 61 in FIG. 7c, covering the exposed surface areas 38 and 39 and other surface areas of the layer 30 now also fully exposed. Thereafter, the remaining regions of the aluminium layer 31 and tungsten layer 36 are removed by etching, as in the original method, and with them all overlying layer materials by lift-off. As a consequence the structure depicted in FIG. 7d is left. This structure corresponds generally with that shown in FIG. 4g except that thin strips, 64, of the chromium layer 61 are also present on the surface of the remaining parts of the layer 30 extending around the pad electrodes 25 and along opposite sides of the address conductors 28.

Although in the above embodiments particular materials have been described for the various layers, it will be appreciated that other materials may be used. For example silicon dioxide, silicon oxy-nitride, tantalum pentoxide, aluminium oxide, and particularly non-stoichiometric mixtures of these materials, may be used for the insulating layer 40. The thickness of the insulating layer would be suitably varied according to the particular material employed so that the necessary MIM action is obtained. Conductive materials, preferably a metal, other than chromium could be used for the layer 41. Different materials can be used also for the layers 31 and 36. It is a condition to the choice of the materials for the layers 31 and 36 however that they be capable of selective etching in the manner required by this method in which, for example it is necessary for the material of the layer 31 to be etched separately from the materials of the layers 30, 36, 40 and 41. Transparent conductive materials other than ITO could be used for the layer 30. For a display device which is to be operated in reflective rather than transmissive mode this conductive layer could be formed of metal. The layer 61 used in the second method may be of a metal other than chromium, for example molybdenum, although in the particular example described chromium is preferred because, unlike molybdenum, it etches very differently to tungsten and aluminium.

Other modifications are possible. For example, a plurality of individual bridging portions may be defined between each region 32 and its associated strip 33 whereby a plurality of MIM type devices are obtained electrically in parallel between the pad electrode and its address conductor in the finished structure to allow a larger current flow between the address conductor and pad electrode and also to provide a degree of redundancy.

While the particular display device described is a liquid crystal display device, the invention is applicable also to other display devices using passive electro-optical display material, for example electrophoretic suspensions and electrochromic materials. Moreover although particularly suitable for use as a component in an active matrix addressed display device, it is envisaged that the array of MIM type devices formed together with their set of address conductors and pad electrodes on a common substrate by these methods could be used as a component in other devices, possibly with other elements being formed on the substrate. In this case, the layer 30 can be of any suitably conductive material.

From reading the present disclosure, other modifications will be apparent to persons skilled in the art. Such modifications may involve other features which are already known in the field of fabricating thin film device arrays and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of fabricating an array of MIM type devices together with address conductors and pad electrodes on a common substrate, each pad electrode being connected to an associated address conductor via at least one MIM type device, which method comprises the steps of:
   (a) providing over the substrate surface a first layer of a selectively etchable conductive material and a second layer of a different, selectively etchable, material overlying the first layer;
   (b) performing a patterning process on the first and second layers with the aid of a mask to leave regions of the two layer structure determining the pad electrodes and the address conductors and a comparatively narrow portion bridging each pad electrode and an associated address;
   (c) depositing a third layer of a selectively etchable material different to said first and second layers so as to cover said regions of the two layer structure and intervening areas;
   (d) performing selective etching to remove first and second layer parts at the bridging portions, with lift-off of overlying material, to expose edge portions of said first and second layers and underlying surface regions of the substrate;
   (e) depositing fourth and fifth layers comprising insulting and conducting material respectively in succession over the substrate and the exposed edges of the first and second layers; and thereafter
   (f) removing the remaining regions of the second and third layers, together with overlying material, by selective etching so as to leave first layer regions constituting the pad electrodes and the address conductors, and bridges of superposed fourth and fifth layer materials extending between each pad electrode and its associated address conductor on the said surface regions of the substrate, thereby forming a MIM type device through which the pad electrode is connected to the address conductor.

2. A method according to claim 1, characterised in that the selective etching and lift off through which the first and second layer parts and overlying material at the bridging portions are removed comprises the steps of selectively etching the material of the second layer to form a discontinuity in this layer with lift off of overlying portions of the third layer at each bridging portions and thereafter etching away the parts of the first layer exposed by the discontinuities.

3. A method according to claim 2, characterised in that a photoresist layer is used in the patterning process on the two layers and that regions of the photoresist layer covering the remaining regions of the two layer structure defined by this process are left in situ while the third, fourth and fifth layers are deposited, and is thereafter removed so as to expose the surface of underlying regions of the second layer.

4. A method according to claim 3, characterised in that after the steps of selective etching and lift off to form said discontinuities and to remove parts of the first layer at the bridging portions and before the step of depositing the fourth layer, the material of the second layer is subjected to a further selective etching whereby further parts of the second layer are removed adjacent the ends of the discontinuities to expose respective upper surface edge portions of the refions of the first layer at opposing ends of the discontinuities.

5. A method according to claim 4, characterised in that the ends of the bridging portion regions of the two layer structure defined by the patterning process are of increased width relative to a central part of the bridging portions.

6. A method according to claim 4, characterised in that after the fourth and fifth layers have been deposited a further, sixth, layer of the same material as the second layer is deposited over the substrate, and after the steps of removing the resist material with lift off of the overlying materials, and before the step of removing the remaining regions of the second and third layers a seventh layer which is of metal and different to the materials of the first, second and third layers is deposited over the substrate.

7. A method according to claim 1, characterised in that the first layer comprises transparent conductive material.

8. A method according to claim 1 characterised in that the second, third, and fifth layers each comprise metal.

* * * * *